United States Patent
Taniguchi

(10) Patent No.: US 6,831,321 B2
(45) Date of Patent: Dec. 14, 2004

(54) SEMICONDUCTOR DEVICE WITH A CAPACITOR ELECTRODE ISOLATION FILM FORMED FROM THE SAME LAYER AS A CAPACITOR ELECTRODE

(75) Inventor: Koji Taniguchi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/226,207

(22) Filed: Aug. 23, 2002

(65) Prior Publication Data

US 2003/0116799 A1 Jun. 26, 2003

(30) Foreign Application Priority Data

Dec. 25, 2001 (JP) ........................................ 2001-391898

(51) Int. Cl.[7] .................... H01L 27/108; H01L 29/76; H01L 29/94; H01L 31/119
(52) U.S. Cl. ........................ 257/303; 301/68; 301/71; 438/396
(58) Field of Search .................... 257/68, 71, 296–313; 438/396

(56) References Cited

U.S. PATENT DOCUMENTS

| | | | | |
|---|---|---|---|---|
| 4,784,969 A | * | 11/1988 | Nitayama | 437/41 |
| 5,302,541 A | * | 4/1994 | Akazawa | 437/52 |
| 5,349,218 A | * | 9/1994 | Tadaki et al. | 257/296 |
| 5,736,760 A | * | 4/1998 | Hieda et al. | 257/301 |
| 6,426,527 B1 | * | 7/2002 | Higashino | 257/309 |
| 6,476,435 B1 | * | 11/2002 | Walker et al. | 257/303 |
| 2003/0011012 A1 | * | 1/2003 | Rhodes | 257/303 |

FOREIGN PATENT DOCUMENTS

| | | | | |
|---|---|---|---|---|
| JP | 2000-208733 | | 7/2000 | |
| JP | 02000232201 | * | 8/2000 | ........... H01L/27/04 |
| KR | 2002058255 | * | 12/2000 | ......... H01L/27/108 |

* cited by examiner

Primary Examiner—Mary Wilczewski
Assistant Examiner—Monica Lewis
(74) Attorney, Agent, or Firm—McDermott Will & Emery LLP

(57) ABSTRACT

A semiconductor device that can prevent short-circuit occurring between capacitor electrodes and a method of manufacturing the semiconductor device are obtained. A semiconductor includes two capacitor electrodes formed spaced from each other and including conductive impurities of the first conductivity type, and an electrode isolation film located between the two capacitor electrodes and formed at the same layer as that of the two capacitor electrodes, while including conductive impurities of the second conductivity type different from the first conductivity type. This allows the two capacitor electrodes to be electrically isolated from each other, without the etching step or the like, by introducing conductive impurities of the second conductivity type into a region that is located between the two capacitor electrodes and is formed at the same layer as that of the capacitor electrodes.

9 Claims, 15 Drawing Sheets

MEMORY CELL REGION | PERIPHERAL CIRCUIT REGION

MEMORY CELL REGION | PERIPHERAL CIRCUIT REGION

MEMORY CELL REGION | PERIPHERAL CIRCUIT REGION

MEMORY CELL REGION | PERIPHERAL CIRCUIT REGION

MEMORY CELL REGION | PERIPHERAL CIRCUIT REGION

MEMORY CELL REGION | PERIPHERAL CIRCUIT REGION

MEMORY CELL REGION | PERIPHERAL CIRCUIT REGION

MEMORY CELL REGION | PERIPHERAL CIRCUIT REGION

MEMORY CELL REGION | PERIPHERAL CIRCUIT REGION

MEMORY CELL REGION | PERIPHERAL CIRCUIT REGION

MEMORY CELL REGION | PERIPHERAL CIRCUIT REGION

MEMORY CELL REGION | PERIPHERAL CIRCUIT REGION

MEMORY CELL REGION | PERIPHERAL CIRCUIT REGION

MEMORY CELL REGION | PERIPHERAL CIRCUIT REGION

SEMICONDUCTOR DEVICE WITH A CAPACITOR ELECTRODE ISOLATION FILM FORMED FROM THE SAME LAYER AS A CAPACITOR ELECTRODE

BACKGROUND OF THE INVENTION

1. Field of the Invention

The present invention relates to a semiconductor device, and more particularly, to a semiconductor device having a capacitor.

2. Description of the Background Art

Conventionally, a semiconductor device such as a DRAM (Dynamic Random Access Memory) is known. FIG. 21 is a schematic cross-section view showing the conventional semiconductor device. FIG. 21 illustrates a cross section of a capacitor portion for storing electric charge, in a DRAM shown as the conventional semiconductor device. The conventional semiconductor device will be described with reference to FIG. 21.

As shown in FIG. 21, a semiconductor memory device 101 represented as a conventional semiconductor device includes field effect transistors (not shown) formed on a main surface of a semiconductor substrate 102, and capacitors electrically connected to source/drain regions of the respective field effect transistors. The main surface of semiconductor substrate 102 includes a memory cell region in which the field effect transistors and capacitors described above are formed, and a peripheral circuit region in which e.g. a circuit for controlling input to/output from elements formed in the memory cell region are arranged. An isolation insulation film 103 is formed to enclose active element regions on the main surface of semiconductor substrate 102. In the active element regions enclosed by isolation insulation film 103, $n^-$ type diffusion regions 104 are formed, respectively, on the main surface of semiconductor substrate 102. Each of the $n^-$ type diffusion regions 104 is electrically connected to the source/drain region of the corresponding field effect transistor.

An interlayer insulation film 105 is formed on the main surface of semiconductor substrate 102. In interlayer insulation film 105, contact holes 106 are formed in regions located above respective $n^-$ type diffusion regions 104. A plug 107 formed of n type polysilicon is arranged to fill in each contact hole 106. A nitride film 108 is formed on interlayer insulation film 105. An oxide film 109 is formed on nitride film 108. In a region located above each plug 107, oxide film 109 and nitride film 108 are partially removed to form an opening 110 in which a capacitor is disposed.

A lower capacitor electrode 111 is formed on the bottom and side walls of opening 110.

A dielectric film 113 of a nitride film is formed on lower capacitor electrode 111. An upper capacitor electrode 114 is formed on dielectric film 113. An interlayer insulation film 115 is formed on upper capacitor electrode 114. In interlayer insulation film 115, a via hole 116 is formed at a region located above an end of upper capacitor electrode 114. A plug 117 made of a conductive material is disposed within via hole 116. At a region located above plug 117, an aluminum interconnection 118 is formed to extend on the top surface of interlayer insulation film 115. Aluminum interconnection 118 is electrically connected with plug 117. Plug 117 in turn is electrically connected with upper capacitor electrode 114. Lower capacitor electrode 111, dielectric film 113 and upper capacitor electrode 114 constitute a capacitor of a memory cell. It is noted that lower capacitor electrode 111 must be electrically insulated from the adjacent lower capacitor electrode 111, since each capacitor stores 1-bit information.

However, the conventional semiconductor device described above had the following problems. In the step of manufacturing the semiconductor device shown in FIG. 21, such a failure may occur that adjacent lower capacitor electrodes 111 are short-circuited, as will be described later. Brief description of the step of manufacturing the lower capacitor electrode in the manufacturing process of the conventional semiconductor device is provided below.

First, elements such as field effect transistors and the like are formed on the main surface of semiconductor substrate 102 using a common method. Thereafter, interlayer insulation film 105, plug 107 filling in contact hole 106, nitride film 108 and oxide film 109 are formed. Next, oxide film 109 and nitride film 108 are partially removed by etching or the like, to form opening 110. Subsequently, a doped polysilicon film (not shown) which is to be lower capacitor electrodes 111 is formed to extend from the inside of opening 110 to the top surface of oxide film 109. Then, portions of the doped polysilicon film that are present on oxide film 109 are removed by etching or the like. As a result, lower capacitor electrodes 111 isolated from one another can be formed.

However, as shown in FIG. 22, at the above-mentioned step of etching the doped polysilicon film, a portion of the doped polysilicon film to be removed (a short-circuiting portion 130 that electrically connect adjacent lower capacitor electrodes 111a and 111b) sometimes remains even after the partial etching, due to a foreign particle present in that portion. As a result, the adjacent lower capacitor electrodes 111a and 111b are short-circuited. Note that FIG. 22 is a schematic cross-section view for illustrating the problems in the conventional semiconductor device.

Even if short-circuiting portion 130 as described above is formed, such short-circuiting portion 130 can rather easily be detected by a wafer test during the manufacturing process. Accordingly, a memory cell including such short-circuited lower capacitor electrodes 111a and 111b can be replaced with a redundant memory cell that was prepared in advance. However, such a replacement work leads to increase in the number of manufacturing steps, resulting in higher manufacturing cost of a semiconductor device.

Moreover, in the above-described etching step of the doped polysilicon film, even if the adjacent lower capacitor electrodes 111a and 111b are completely isolated from each other, a microscopic foreign particle 123 may adhere between lower capacitor electrodes 111a and 111b, as shown in FIG. 23. Such adherence of foreign particle 123 may not be detected by the wafer test, since lower capacitor electrodes 111a and 111b are not completely short-circuited. However, the presence of such a foreign particle 123 causes so-called micro-shorting, i.e., making the resulting semiconductor device defective after packaged as a product. Note that FIG. 23 is another schematic cross-section view for illustrating problems in the conventional semiconductor device.

As such, short-circuiting between lower capacitor electrodes due to an etching residue or a foreign particle is one cause of the problems in the semiconductor device, such as reduction of the yield and increase of the manufacturing cost. Accordingly, in such a semiconductor device that targets improvement of yield and reduction of manufacturing cost, it is strongly required to prevent occurrence of short-circuiting between capacitor electrodes, such as the lower capacitor electrodes as described above.

SUMMARY OF THE INVENTION

An object of the present invention is to provide a semiconductor device that can suppress occurrence of short-circuiting between capacitor electrodes, and a method of manufacturing the semiconductor device.

According to one aspect of the present invention, a semiconductor device includes two capacitor electrodes formed to be spaced from each other and including conductive impurities of a first conductivity type, and an electrode isolation film located between the two capacitor electrodes, and formed at the same layer as that of the two capacitor electrodes, while including conductive impurities of a second conductivity type which is different from the first conductivity type.

Thus, by introducing conductive impurities of the second conductivity type into a portion located between the two capacitor electrodes and formed at the same layer as that of the capacitor electrodes, the two capacitor electrodes can be electrically isolated without the step of etching or the like performed. This can prevent occurrence of short-circuiting between the capacitor electrodes due to an etching residue.

Specifically, an example is given in which a semiconductor memory device such as a DRAM is used as a semiconductor device, and n type conductive impurities such as phosphorus are included in the capacitor electrodes as the conductive impurities of the first conductivity type. Here, p type conductive impurities such as boron are included in the electrode isolation film located between the two capacitor electrodes, as the conductive impurities of the second conductivity type. When the capacitor electrodes are to store one of logic high or "H" data and logic low or "L" data, each capacitor electrode is set to have potentials of 2.0V and 0V, respectively. When such potentials are applied to the capacitor electrodes, a potential of e.g. −1.0V is applied to the electrode isolation film. This can suppress current flowing between the two capacitor electrodes via the electrode isolation film, allowing electrical isolation between the two capacitor electrodes.

Furthermore, in the conventional semiconductor device, once the capacitor electrodes are short-circuited due to insufficient etching in the etching step or the like for isolating the capacitor electrodes from one another, it is difficult to recover the short-circuited portion to a normal state. In the semiconductor device according to the present invention, if conductive impurities of the second conductivity type are insufficiently introduced into the electrode isolation film to partially form a defective portion with no conductive impurities introduced, heat treatment may be applied that heats the semiconductor device in the step subsequent to the impurity-introducing step. This allows the conductive impurities to diffuse from the doped portion to the defective undoped portion in the electrode isolation film. Thus, in the semiconductor device according to the present invention, even if an undoped portion (a portion with no conductive impurities introduced) occurs in the step of introducing conductive impurities into the electrode isolation film, e.g., the implantation step, heat treatment or the like may be performed in the subsequent step to eliminate such an undoped portion. As a result, possibility can be lowered that the capacitor electrodes are short-circuited in the semiconductor device.

In the semiconductor device according to the present aspect, the two capacitor electrodes and the electrode isolation film may be formed by introducing conductive impurities of the first conductivity type and the second conductivity type, respectively, into one semiconductor film.

The semiconductor device according to the present aspect may include a potential determination part for determining the potential of the electrode isolation film.

Here, the potential of the electrode isolation film can arbitrary be changed. Thus, the potential of the electrode isolation film can be determined to be adapted to the potential set for the capacitor electrode, thereby preventing current from flowing through a junction (pn junction) between each capacitor electrode and the electrode isolation film. Therefore, the electrode isolation film allows electrical isolation between the two capacitor electrodes.

Further, when the present invention is applied to a concave capacitor, in which respective capacitor electrodes are arranged inside of a plurality of openings formed on an underlying film such as an interlayer insulation film, the electrode isolation film is arranged on the top surface of the underlying film located between the respective openings. Preferably, the electrode isolation film is formed to extend to the inside of the openings in the underlying film, such that the top surfaces of the capacitor electrodes are located at a sufficient distance below the top surface of the underlying film. Thus, even if a foreign particle is present at an upper part of an opening, it does not directly adhere to a capacitor electrode, but to the electrode isolation film. As a result, short-circuiting between the capacitor electrodes due to the presence of a foreign particle can be prevented.

In the semiconductor device according to the above aspect, each of the capacitor electrodes forming the concave capacitor may have a top surface, and the electrode isolation film may extend to the top surface of the capacitor electrodes.

Moreover, when the present invention is applied to a stacked capacitor, formation of a concave portion between the capacitor electrodes can be prevented, since the electrode isolation film is disposed between the capacitor electrodes. This cannot be achieved by the conventional semiconductor device, in which a conductor film (a film of the same layer as the film forming the capacitor electrodes) is removed by etching or the like from the space between the capacitor electrodes to isolate the two capacitor electrodes. Thus, a dielectric film formed on the capacitor electrodes, an upper capacitor electrode, an interlayer insulation film and the like may have relatively flat top surfaces. This can prevent breaking of interconnections or the like due to the shape of the top surface of the interlayer insulation film, when the interconnections or the like are formed to be laminated on the capacitor electrodes, i.e., breaking of interconnections or the like due to the presence of the concave portion described above can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
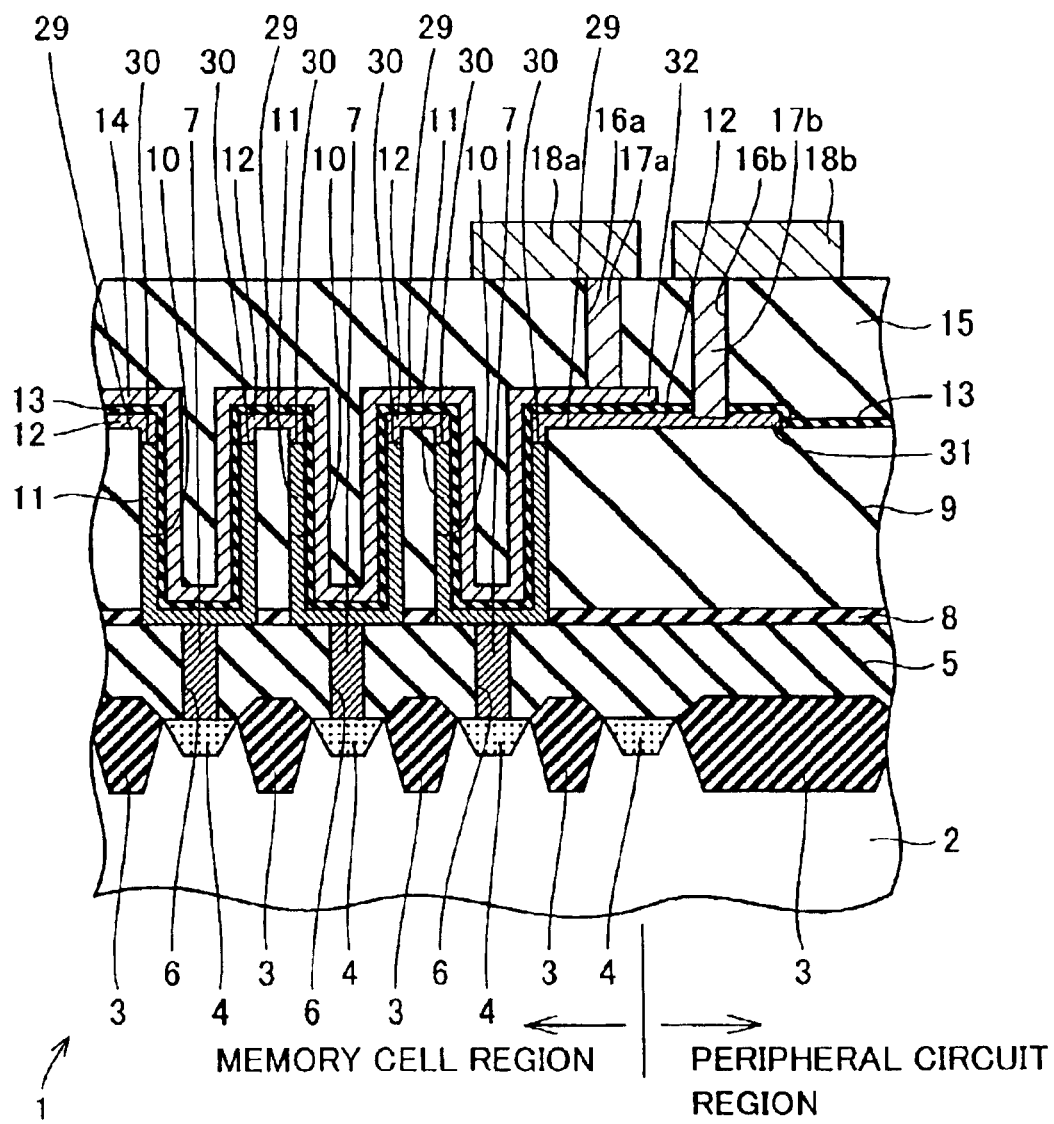
FIG. 1 shows a schematic cross-section view for illustrating the first embodiment of a semiconductor memory device according to the present invention.

Embodiments of the present invention will now be described below with reference to the drawings. It is noted that the same or corresponding portions in the drawings are denoted by the same reference numbers, and the description thereof will not be repeated.

First Embodiment

Referring to FIG. 1, the first embodiment of a semiconductor memory device according to the present invention is described. A DRAM (Dynamic Random Access Memory) is illustrated in FIG. 1 as a semiconductor device, showing a cross section of a capacitor portion for storing electric charge.

As shown in FIG. 1, a semiconductor memory device 1 as a semiconductor device according to the present invention includes field effect transistors (not shown) formed on the main surface of a semiconductor substrate 2, and a plurality of capacitors electrically connected with the source/drain regions of the respective field effect transistors. The main surface of semiconductor substrate 2 is constituted by a memory cell region in which the field effect transistors and capacitors described above are formed, and a peripheral circuit region in which a circuit and the like for controlling input to/output from elements formed in the memory cell region.

An isolation insulation film 3 is formed on the main surface of semiconductor substrate 2 to enclose active element regions. In each of the active element regions enclosed by isolation insulation film 3, an n⁻ type diffusion region 4 is formed on the main surface of semiconductor substrate 2. Each n⁻ type diffusion region 4 is electrically connected to the source/drain region of the corresponding field effect transistor.

Interlayer insulation film 5 is formed on the main surface of semiconductor substrate 2. In interlayer insulation film 5, contact holes 6 are formed in regions located above respective n⁻ type diffusion regions 4. A plug 7 of n type polysilicon is arranged to fill in each contact hole 6. A nitride film 8 is formed on interlayer insulation film 5. An oxide film 9 is formed on nitride film 8. Oxide film 9 and nitride film 8 are partially removed at a region located above plug 7, to form openings 10 in which respective capacitors are to be arranged.

A lower capacitor electrode 11 is formed as a capacitor electrode on the bottom and side walls of each opening 10. A top surface 30 of lower capacitor electrode 11 is formed at a position lower, i.e., closer to semiconductor substrate 2, than a top surface 29 of oxide film 9. A lower plate electrode 12 is formed as an electrode isolation film, which is connected to top surface 30 of lower capacitor electrode 11 while extending from an upper sidewall of opening 10 to top surface 29 of oxide film 9. Lower capacitor electrode 11 and lower plate electrode 12 are formed at the same layer, though they have different conductivity types. Lower capacitor electrode 11 is formed of an n type polysilicon film doped with phosphorous as conductive impurities of the first conductivity type. By contrast, lower plate electrode 12 is formed of a polysilicon film made to have a p type by implanting boron as conductive impurities of the second conductivity type, which will become clear by the manufacturing method described later. This results in electrical insulation between lower capacitor electrode 11 and lower plate electrode 12, as will be described later.

A dielectric film 13 of a nitride film is formed on lower capacitor electrode 11, lower plate electrode 12 and oxide film 9. An upper capacitor electrode 14 is formed on dielectric film 13. An end 32 of upper capacitor electrode 14 is arranged at a position closer to opening 10 than an end 31 of lower plate electrode 12, i.e., end 31 of lower plate electrode 12 extends more outwards than end 32 of upper capacitor electrode 14. Lower capacitor electrode 11, dielectric film 13 and upper capacitor electrode 14 constitute a so-called concave capacitor.

Interlayer insulation film 15 is formed on upper capacitor electrode 14 and dielectric film 13. In interlayer insulation film 15, a via hole 16a is formed at a region located above end 32 of upper capacitor electrode 14. Moreover, at a region located above end 31 of lower plate electrode 12, a via hole 16b is formed by partially removing interlayer insulation film 15 and dielectric film 13. Plugs 17a and 17b of a conductive material are formed within via holes 16a and 16b, respectively.

At regions located above plugs 17a and 17b, aluminum interconnections 18a and 18b are formed, respectively, to extend over the top surface of interlayer insulation film 15. Aluminum interconnections 18a and 18b are electrically connected with plugs 17a and 17b, respectively. Further, the bottom surface of plug 17a abuts the top surface of upper capacitor electrode 14, i.e., plug 17a is electrically connected with upper capacitor electrode 14. Likewise, the bottom surface of plug 17b abuts the surface of lower plate electrode 12, i.e., plug 17b is electrically connected with lower plate electrode 12. Thus, aluminum interconnection 18b and plug 17b constitute a potential determination part for determining a potential of lower plate electrode 12.

Figure 2:
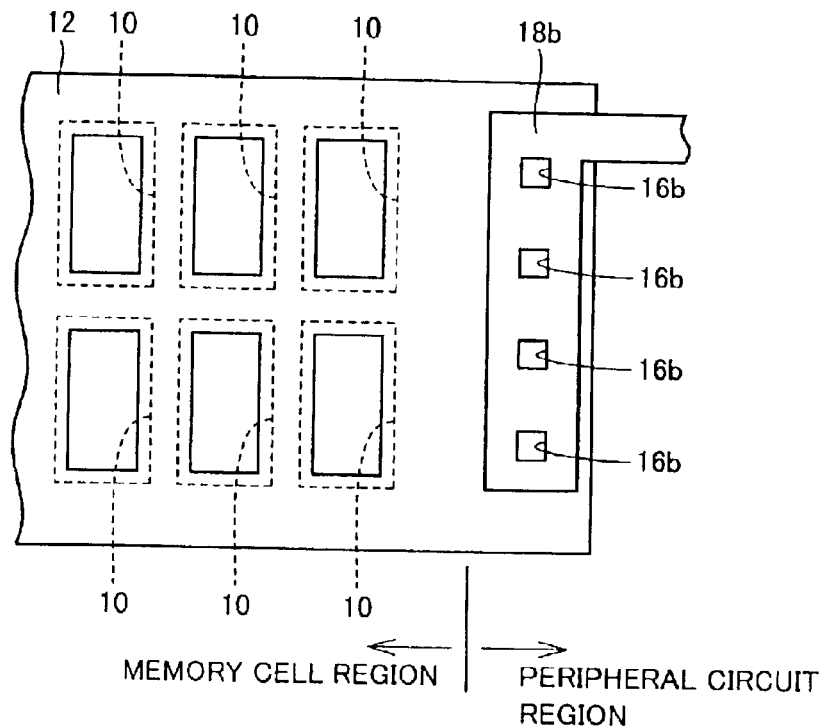
FIG. 2 shows a schematic plan view for illustrating the flat shape of a lower plate electrode in the semiconductor memory device shown in FIG. 1.

Lower plate electrode 12 is formed at the same layer as that of lower capacitor electrode 11 as described above, and extends over the top surface of oxide film 9 around opening 10 as shown in FIG. 2.

Subsequently, the operation of the semiconductor memory device shown in FIG. 1 is briefly described. In the semiconductor memory device shown in FIG. 1, information can be stored by storing charge in lower capacitor electrode 11 that functions as a charge storage electrode. Assuming that the power-supply voltage is, for example, 2.0V, the potential of lower capacitor electrode 11 is set at 2.0V when "H" data is stored in lower capacitor electrode 11. When, on the other hand, "L" data is stored in lower capacitor electrode 11, the potential of lower capacitor electrode 11 is set at 0V. By setting the potential of lower plate electrode 12 at −1.0V through aluminum interconnection 18b and plug 17b, adjacent lower capacitor electrodes 11 can be electrically isolated.

Moreover, since plug 17b and aluminum interconnection 18b are formed as a potential determination part, the potential of lower plate electrode 12 can be determined to conform to the potential set for lower capacitor electrode 11 as described above, such that no current flows though the junction between lower capacitor electrode 11 and lower plate electrode 12. Thus, the two lower capacitor electrodes 11 can be electrically isolated from each other by lower plate electrode 12 serving as an electrode isolation film.

Next, the manufacturing method of the semiconductor memory device shown in FIG. 1 will be described with reference to FIGS. 3 to 8.

Figure 3:
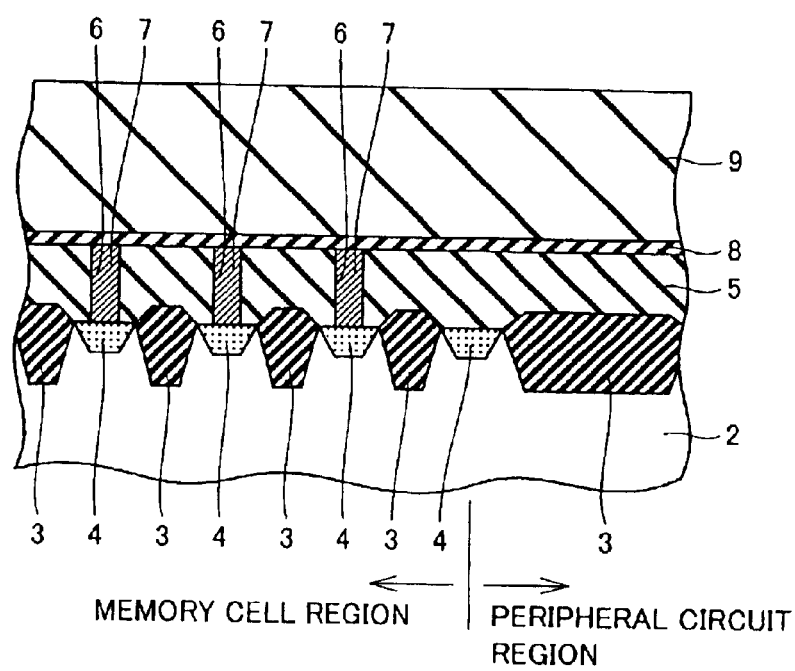
FIGS. 3 to 8 show schematic cross-section views for illustrating the first to the sixth steps in a method of manufacturing the semiconductor memory device shown in FIG. 1.
Figure 4:
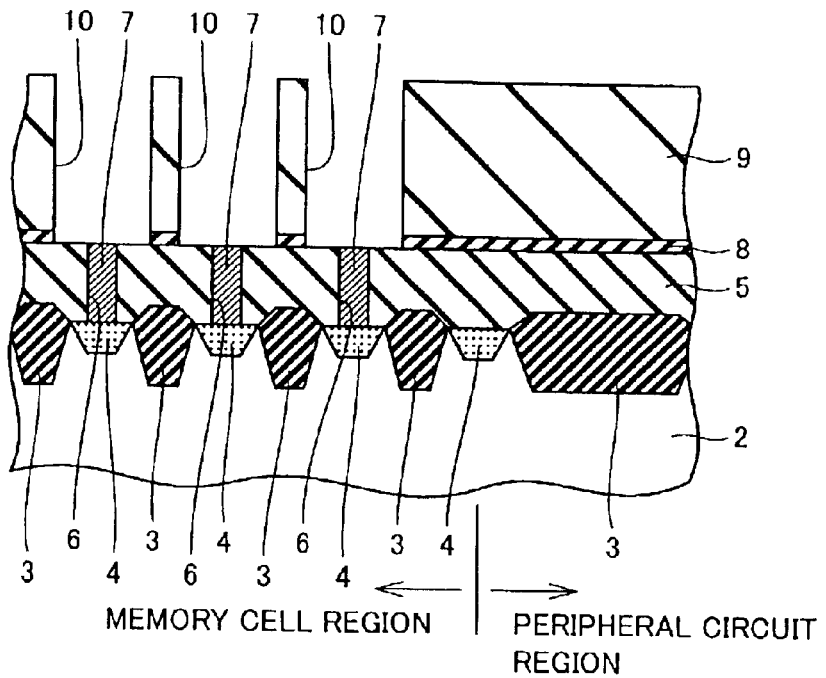

First, isolation insulation film 3 (see FIG. 3) and n⁻ type diffusion regions 4 (see FIG. 3) are formed using a common method on the main surface of semiconductor substrate 2 (see FIG. 3). Further, field effect transistors (not shown) are formed on the main surface of semiconductor substrate 2. Then, interlayer insulation film 5 (see FIG. 3) is formed on isolation insulation film 3, n⁻ type diffusion regions 4 and the field effect transistors. Thereafter, contact holes 6 (see FIG. 3) are formed in interlayer insulation film 5 at regions located above respective n⁻ type diffusion regions 4 using a photolithography technique or the like. Each contact hole 6 is filled with plug 7 (see FIG. 3) of n type polysilicon. Plug 7 is to electrically connect each n⁻ type diffusion region 4 and lower capacitor electrode 11 (see FIG. 1).

Then, nitride film 8 (see FIG. 3) is formed on the top surface of interlayer insulation film 5. Nitride film 8 is formed to have a thickness of e.g. 50 nm (500 Å). Oxide film 9 (see FIG. 3) is formed on nitride film 8. Oxide film 9 may have a thickness of e.g. 1500 nm (15000 Å). As such, the structure as shown in FIG. 3 can be obtained.

Next, a resist film (not shown) having a pattern is formed on the top surface of oxide film 9. Using the resist film as a mask, oxide film 9 and nitride film 8 are partially removed by etching, to form openings 10 (see FIG. 4). The resist film is then removed. This results in the structure shown in FIG. 4.

Figure 5:
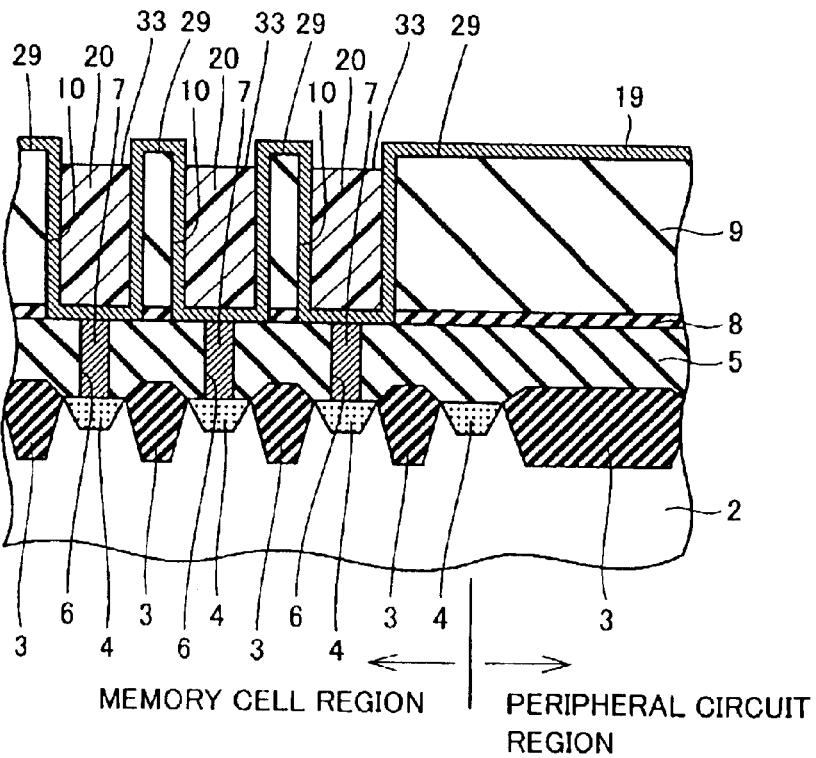

Subsequently, as shown in FIG. 5, an n type polysilicon film 19 doped with phosphorus used as conductive impurities of the first conductivity type is formed to extend from the inside of opening 10 to the top surface of oxide film 9. Thereafter, a resist film 20 is formed on n type polysilicon film 19, which is a conductive film, using the photolithography technique to fill in opening 10. It is noted that resist film 20 is formed such that a top surface 33 of resist film 20 is located lower than top surface 29 of oxide film 9.

Figure 6:
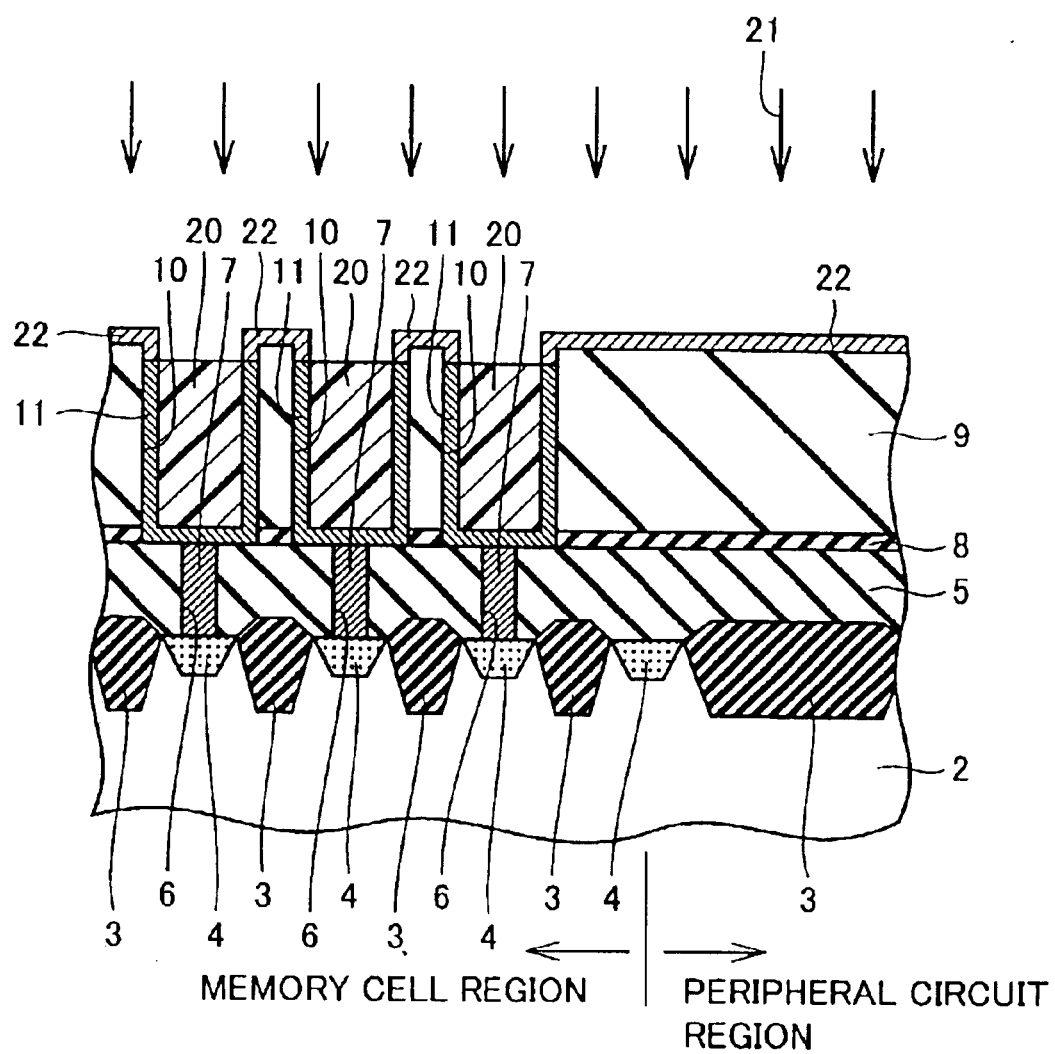

Next, as shown in FIG. 6, boron, i.e., p type conductive impurities of the second conductivity type, is introduced into n type polysilicon film 19 (see FIG. 5) as indicated by arrows 21. The boron is introduced by a common implantation step. Such boron implantation allows a part of n type polysilicon film 19 to be a p type polysilicon film 22. The portion of n type polysilicon film 19 located within opening 10 remains undoped with boron in the step of implanting boron, since resist film 20 functions as a mask. A portion where n type polysilicon film 19 remains (a portion located within opening 10) forms lower capacitor electrode 11. Further, p type polysilicon film 22 located between adjacent lower capacitor electrode 11 constitutes lower plate electrode 12 (see FIG. 1). Lower capacitor electrode 11 and lower plate electrode 12 are thus formed by changing the conductivity type of conductive impurities to be introduced into the polysilicon film employed as a semiconductor film. Lower plate electrode 12 serves to electrically insulate adjacent two lower capacitor electrodes 11, as described earlier.

Thus, lower capacitor electrode 11 can be electrically isolated by forming lower plate electrode 12 as an electrode isolation film, without an etching step performed on n type polysilicon film 19 (see FIG. 5) which is a conductive film. This can prevent short-circuiting between two lower capacitor electrodes 11 due to an etching residue, which may occur when n type polysilicon film 19 is etched to isolate two lower capacitor electrodes 11.

Figure 21:
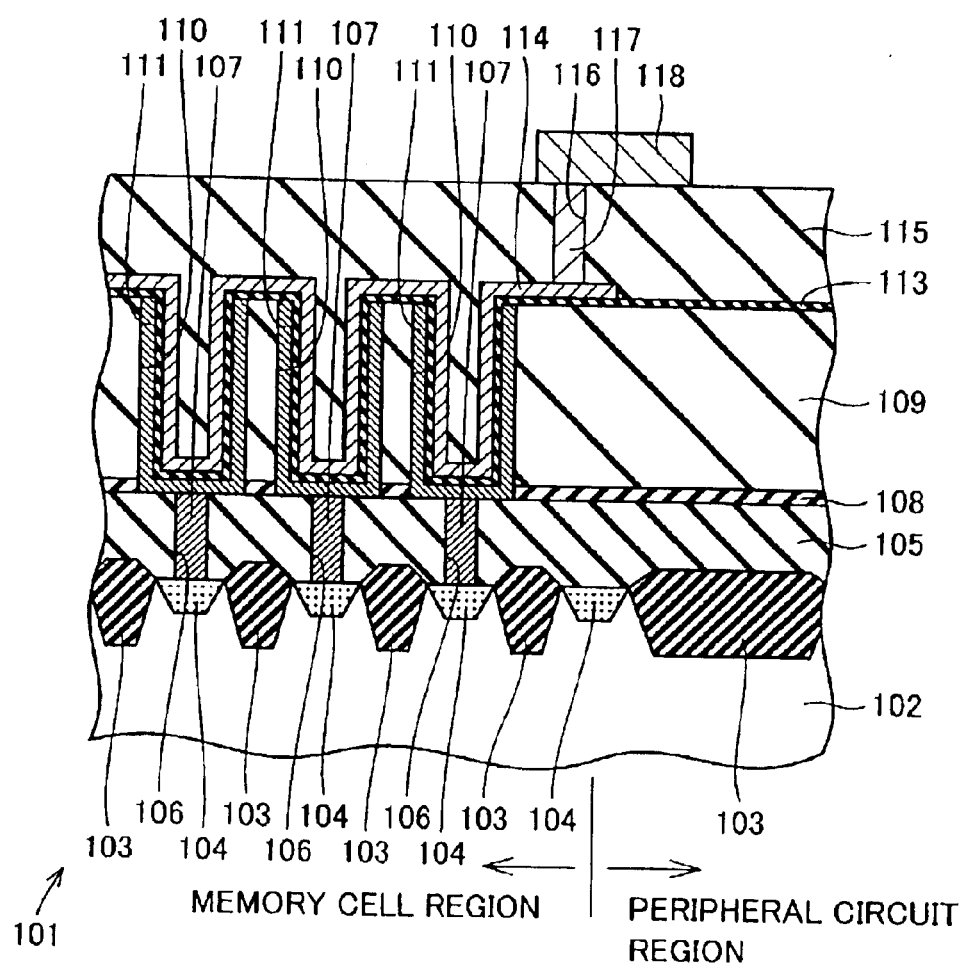
FIG. 21 shows a schematic cross-section view for illustrating the conventional semiconductor device.
Figure 22:
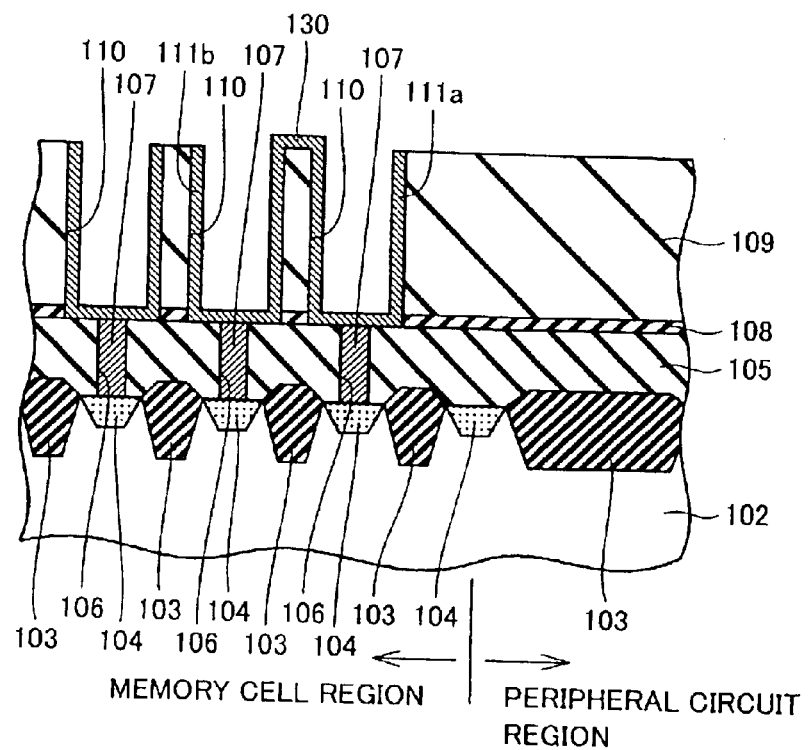
FIG. 22 shows a schematic cross-section view for illustrating a problem in the conventional semiconductor device.
Figure 23:
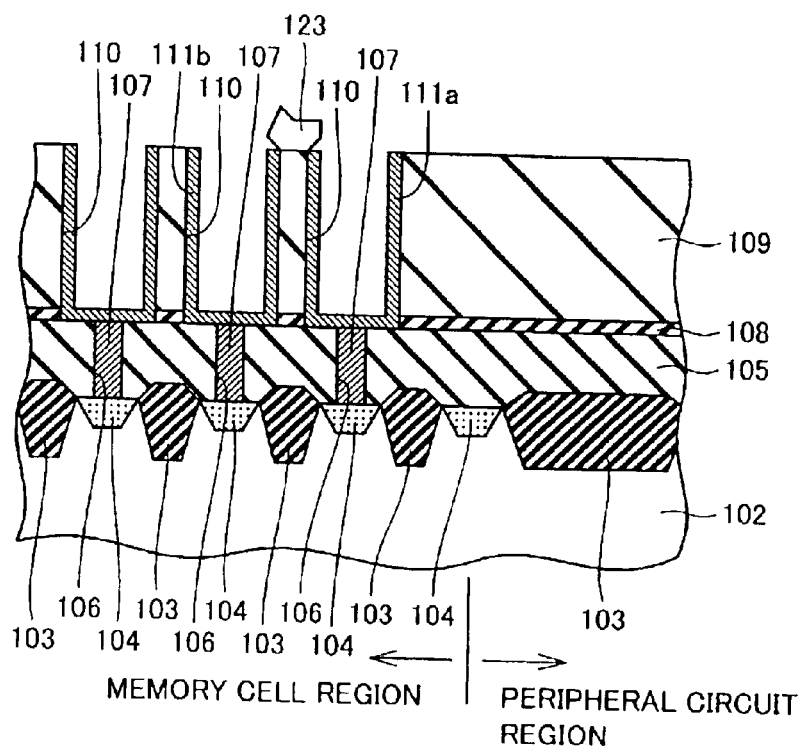
FIG. 23 shows another schematic cross-section view for illustrating a problem in the conventional semiconductor device.

Further, in the conventional semiconductor memory device as shown in FIG. 21, once lower capacitor electrodes 111 are short-circuited because of insufficient etching in the etching step or the like for isolating lower capacitor electrodes 111, it is difficult to recover the short-circuited portion to a normal state. By contrast, considering the case of the semiconductor memory device according to the present invention, where a defective portion, i.e. a portion not doped with boron, occurs in p type polysilicon film 22 which is formed by introducing boron as conductive impurities of the second conductivity type into a portion of n type polysilicon film 19 that is to be an electrode isolation film. In such a case, heat treatment may be applied to heat the semiconductor memory device at the step subsequent to the implantation step, i.e., the step of introducing boron, to allow the boron to diffuse from the doped portion to the defective undoped portion in p type polysilicon film 22. Thus, in the semiconductor memory device according to the present invention, even if an undoped portion (a portion with no boron introduced) occurs in the boron implantation step for forming p type polysilicon film 22, such a defective undoped portion can be eliminated by the heat treatment performed at the subsequent step. As a result, probability of short-circuiting between lower capacitor electrodes 11 can be lowered in the semiconductor memory device.

Figure 7:
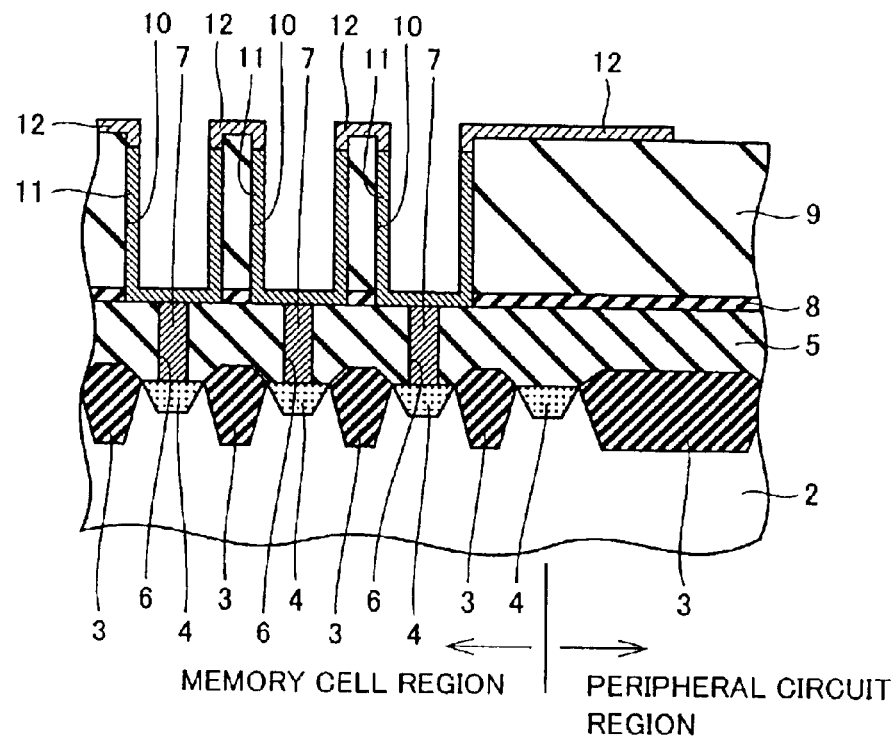

Subsequently, photoresist film 20 located within opening 10 is removed. Then, a resist film (not shown) having a pattern is formed, using a photolithography technique, on lower capacitor electrode 11 located within p type polysilicon film 22 and opening 10. The resist film is used as a mask to remove a part of a portion of p type polysilicon film 22 that is located in the peripheral circuit region. Thereafter, the resist film is removed. Thus, lower plate electrode 12 (see FIG. 7) arranged to enclose the periphery of opening 10 having lower capacitor electrode 11 therein is formed. This results in the structure as shown in FIG. 7.

Figure 8:
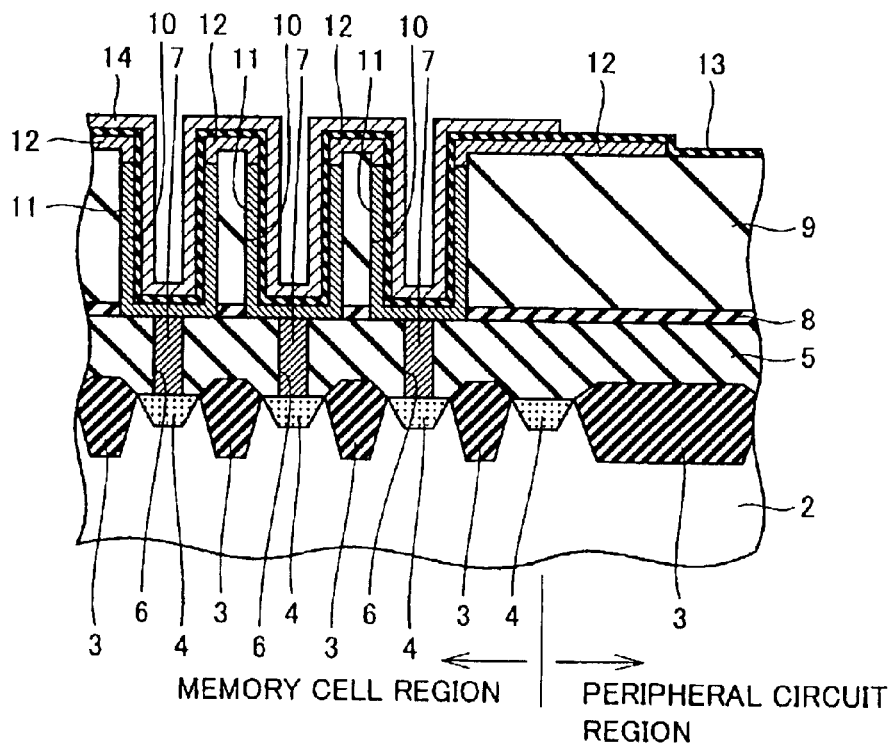

Next, dielectric film 13 (see FIG. 8) is deposited on lower capacitor electrode 11, lower plate electrode 12 and oxide film 9. A nitride film can be used as dielectric film 13. An n type polysilicon film (not shown) which is to be an upper capacitor electrode 14 (see FIG. 8) is deposited on dielectric film 13 which is to be a capacitor dielectric film. A resist film (not shown) having a pattern is formed that covers a region in which an upper capacitor electrode is to be formed, using the photolithography technique, on the n type polysilicon film. The resist film is used as a mask to partially remove the n type polysilicon film. Thereafter, the resist film is removed. This results in the structure as shown in FIG. 8.

Subsequently, interlayer insulation film 15, via holes 16a and 16b, plugs 17a and 17b filling in respective via holes 16a and 16b, and aluminum interconnections 18a and 18b connected to plugs 17a and 17b, respectively, are formed. Thus, the semiconductor memory device shown in FIG. 1 can be obtained.

Figure 9:
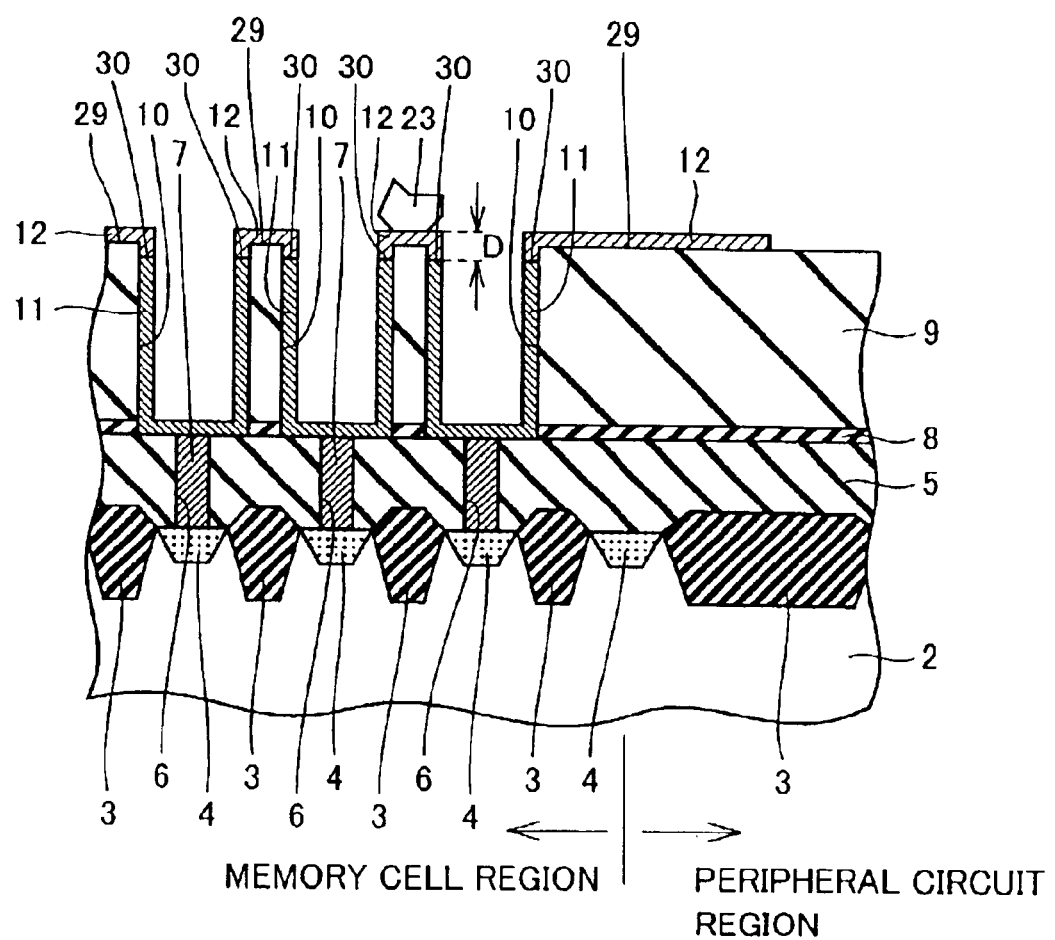
FIG. 9 shows a schematic cross-section view for illustrating an effect of the semiconductor memory device according to the present invention.

Here, considering the case where a foreign particle 23 adheres on semiconductor substrate 2 with lower plate electrode 12 formed thereon, as shown in FIG. 9. Even if foreign particle 23 adheres on lower plate electrode 12 located between openings 10, it will not be in contact with lower capacitor electrode 11, since lower capacitor electrode 11 is located within opening 10 and top surface 30 of lower capacitor electrode 11 is located lower than top surface 29 of oxide film 9, i.e., lower plate electrode 12 is formed to extend to the inside of opening 10. This can prevent a failure such that adjacent lower capacitor electrodes 11 are short-circuited due to foreign particle 23.

Moreover, a distance D, from the top surface of lower plate electrode 12 to top surface 30 of lower capacitor electrode 11, may readily be changed by implantation energy or dose of boron shown in FIG. 6. This ensures avoidance of short-circuiting between lower capacitor electrodes 11 due to foreign particle 23 by appropriately setting distance (D).

Second Embodiment

Figure 10:
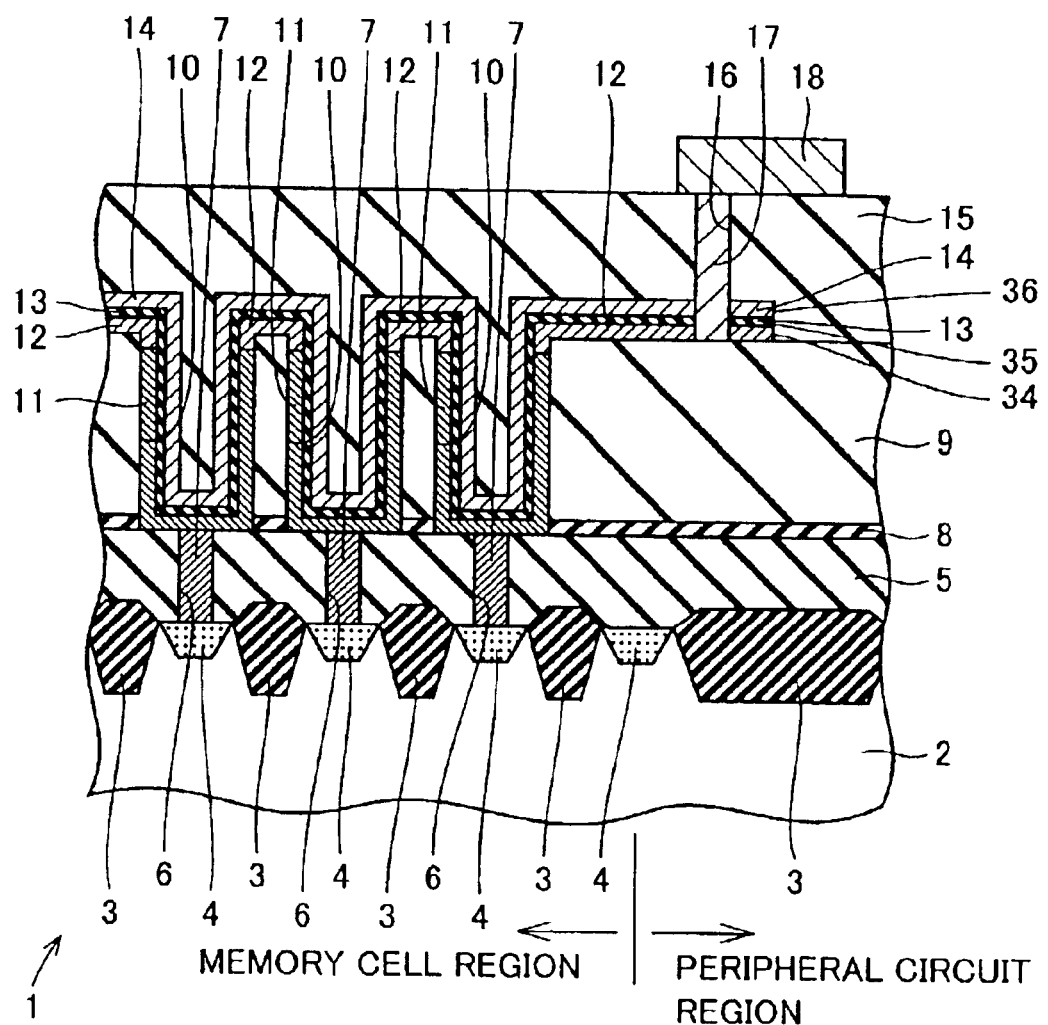
FIG. 10 shows a schematic cross-section view for illustrating the second embodiment of the semiconductor memory device according to the present invention.

Referring to FIG. 10, the second embodiment of the semiconductor memory device according to the present invention will be described. FIG. 10 corresponds to FIG. 1.

As shown in FIG. 10, semiconductor memory device 1 as a semiconductor device according to the present invention basically has a structure similar to that of the semiconductor memory device shown in FIG. 1, except for a portion that applies a potential to upper capacitor electrode 14 and lower plate electrode 12. In semiconductor memory device 1 shown in FIG. 10, lower plate electrode 12, dielectric film 13 and upper capacitor electrode 14 extending over oxide film 9 have respective end surfaces 34 to 36 aligned approximately coplanar.

Further, interlayer insulation film 15, upper capacitor electrode 14, dielectric film 13 and lower plate electrode 12 are partially removed to form via hole 16. Via hole 16 is filled with plug 17 of a conductive material. Aluminum interconnection 18 is formed on the top surface of interlayer insulation film 15, to be electrically connected with plug 17. At the side walls of via hole 16, the surfaces of upper capacitor electrode 14 and lower plate electrode 12 are exposed. Thus, plug 17 is in contact with upper capacitor electrode 14 and lower plate electrode 12. Therefore, a potential can be applied from aluminum interconnection 18 through plug 17 to upper capacitor electrode 14 and lower plate electrode 12. Upper capacitor electrode 14 and lower plate electrode 12 are electrically connected with each other.

This can also obtain an effect similar to that of the semiconductor memory device shown in FIG. 1.

Furthermore, as interconnection 18 connected to upper capacitor electrode 14 may be used to apply a potential to lower plate electrode 12, the structure of semiconductor memory device 1 can be simplified.

Preferably, in semiconductor memory device 1 shown in FIG. 10, the potential of lower plate electrode 12 and upper capacitor electrode 14 may be fixed at, for example, approximately −1.0V, since lower capacitor electrodes 11 are electrically isolated from each other by lower plate electrode 12. This allows electrical isolation between lower capacitor electrodes 11 by lower plate electrode 12 as in the semiconductor memory device shown in FIG. 1.

Figure 11:
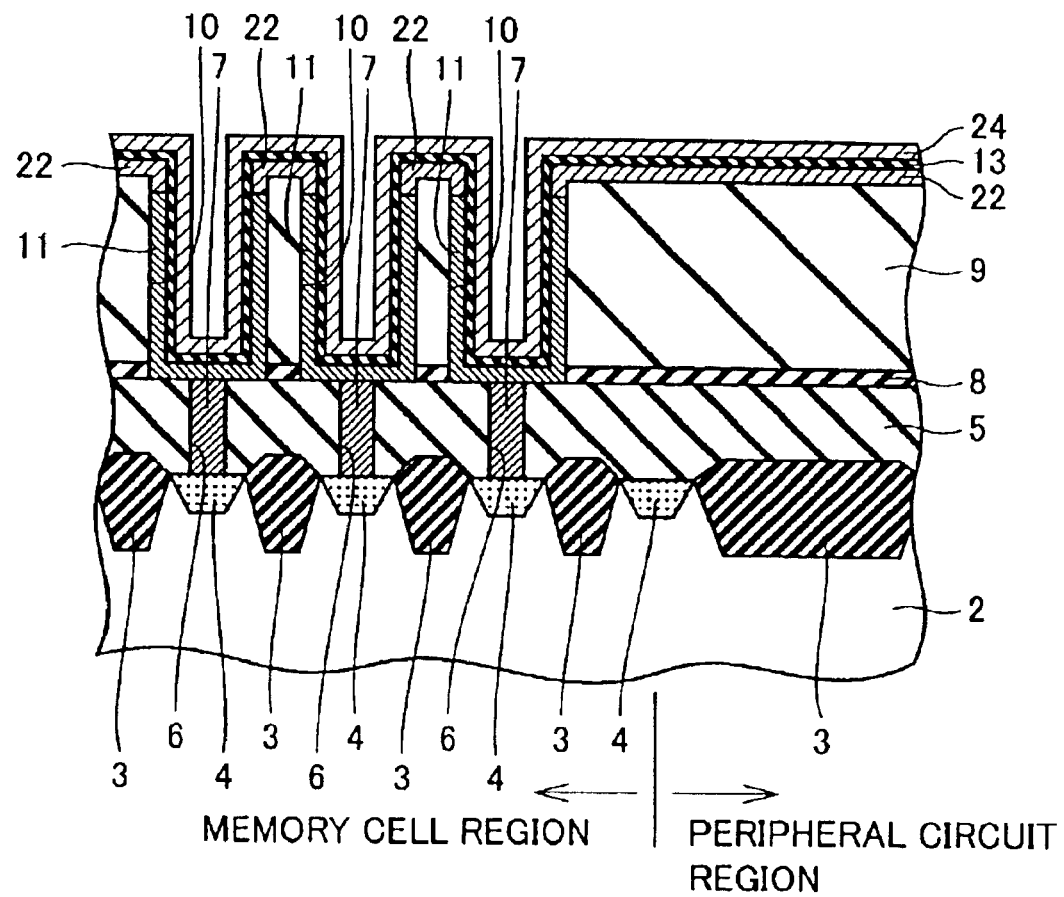
FIGS. 11 and 12 show schematic cross-section views for illustrating the first and second steps of a method of manufacturing the semiconductor memory device shown in FIG. 10.
Figure 12:
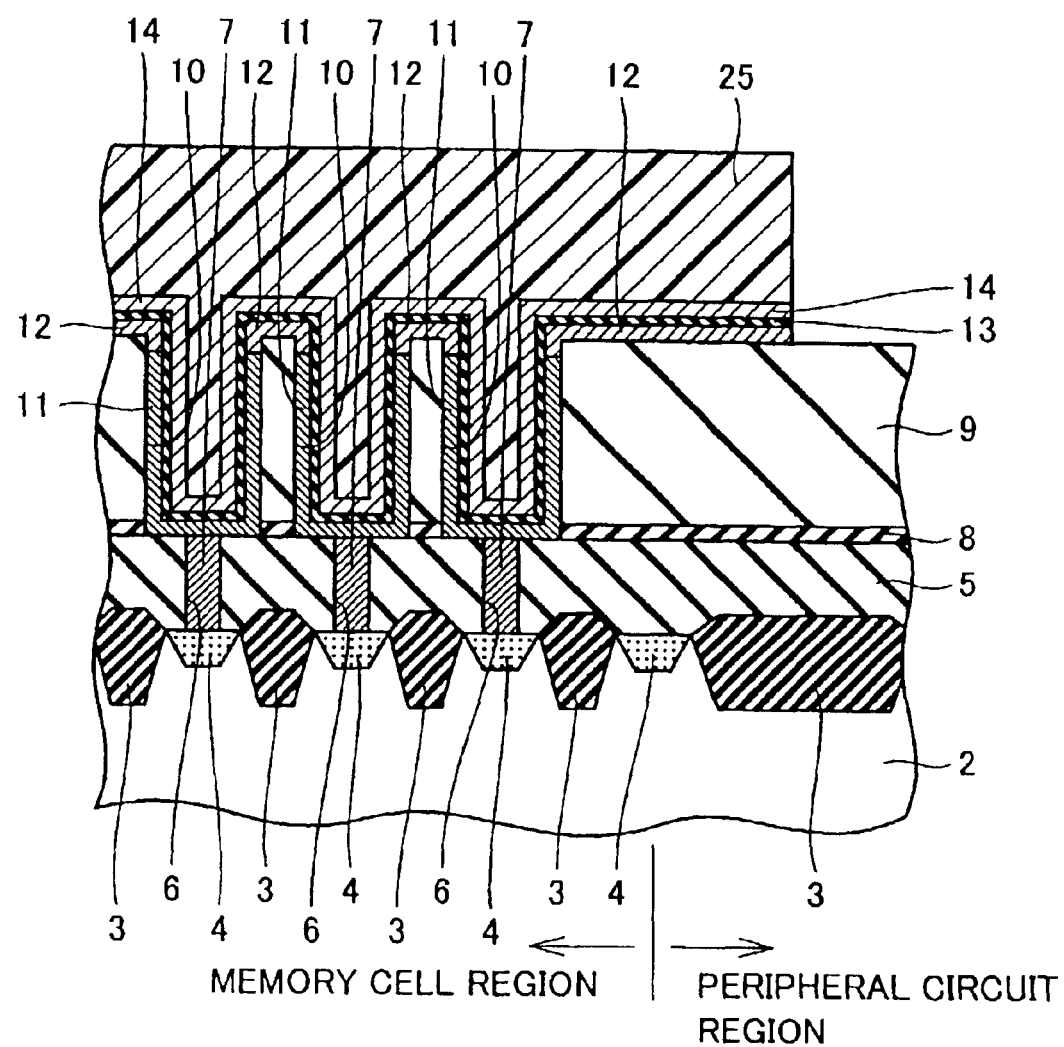

Referring to FIGS. 11 and 12, a method of manufacturing the semiconductor memory device shown in FIG. 10 is described.

First, the steps similar to those shown in FIGS. 3 to 6 are performed. Subsequently, as shown in FIG. 11, dielectric film 13 is formed on p type polysilicon film 22 and lower capacitor electrode 11. Then, n type polysilicon film 24 is formed as an upper conductive film on dielectric film 13.

Next, a photolithography technique is used to form resist film 25 (see FIG. 12) having a pattern, on n type polysilicon film 24. Thereafter, resist film 25 is used as a mask to partially remove n type polysilicon film 24, dielectric film 13 and p type polysilicon film 22 by anisotropic etching. As a result, upper capacitor electrode 14 (see FIG. 12), dielectric film 13 (see FIG. 12) and lower plate electrode 12 (see FIG. 12) of n type polysilicon film 24 are formed. Thus, the structure as shown in FIG. 12 is obtained.

Subsequently, resist film 25 is removed. Interlayer insulation film 15 (see FIG. 10), via hole 16 (see FIG. 10), plug 17 (see FIG. 10) filling in via hole 16, and aluminum interconnection 18 (see FIG. 10) are formed using a common technique. Thus, the semiconductor memory device as shown in FIG. 10 can be obtained.

In the manufacturing method of the first embodiment of the semiconductor memory device according to the present invention, the photolithography step is required twice in order to form lower plate electrode 12 and upper capacitor electrode 14. However, in the manufacturing method of the semiconductor memory device shown in FIGS. 11 and 12, the photolithography step is required only once in order to form both lower plate electrode 12 and upper capacitor electrode 14. This can reduce the number of mask alignment processes and the number of masks to be prepared.

Third Embodiment

Figure 13:
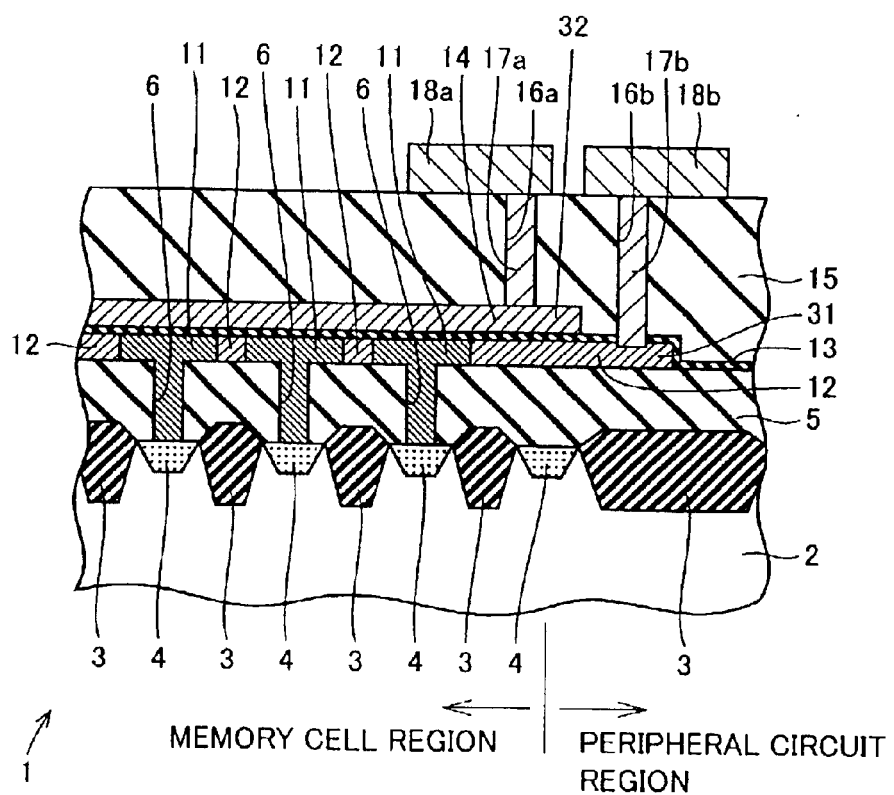
FIG. 13 shows a schematic cross-section view for illustrating the third embodiment of the semiconductor memory device according to the present invention.

Referring to FIG. 13, the third embodiment of the semiconductor memory device according to the present invention is described.

As shown in FIG. 13, semiconductor memory device 1 basically has a structure similar to that of the semiconductor memory device shown in FIG. 1, except for a capacitor. The semiconductor memory device shown in FIG. 1 has a so-called concave capacitor in which lower capacitor electrode 11 is formed within opening 10 formed in interlayer insulating film 15. By contrast, the capacitor in the semiconductor memory device shown in FIG. 13 is a so-called stacked capacitor. Specific description will be provided below.

As shown in FIG. 13, layers from interlayer insulation film 5 down to semiconductor substrate 2, i.e., layers at and below interlayer insulation film 5, are basically structured in a manner similar to those of the semiconductor memory device shown in FIG. 1. Lower capacitor electrode 11 of n type polysilicon is formed extending from the inside of contact hole 6 formed in interlayer insulation film 5 to the top surface of interlayer insulation film 5. On the top surface of interlayer insulation film 5, lower plate electrode 12 of a p type polysilicon film is disposed in a region between and around adjacent lower capacitor electrodes 11. Lower capacitor electrode 11 and lower plate electrode 12 are formed at the same layer, as will be apparent from the subsequent description of the manufacturing method.

Dielectric film 13 of a nitride film is formed on lower capacitor electrode 11 and lower plate electrode 12. Upper capacitor electrode 14 of an n type polysilicon film is formed on dielectric film 13. End 31 of lower plate electrode 12 is arranged to extend more outward than end 32 of upper capacitor electrode 14.

Interlayer insulation film 15 is formed on upper capacitor electrode 14. At interlayer insulation film 15, via hole 16a is formed in a region located above end 32 of upper capacitor electrode 14. Further, via hole 16b is formed in a region located above end 31 of lower plate electrode 12, by partially removing interlayer insulation film 15 and dielectric film 13. Via holes 16a and 16b are filled with plugs 17a and 17b. Above plugs 17a and 17b, aluminum interconnections 18a and 18b are formed on the top surface of interlayer insulation film 15.

In the semiconductor memory device with such a structure, lower capacitor electrodes 11 can also be electrically isolated by lower plate electrode 12, achieving an effect similar to that of the semiconductor memory device shown in FIG. 1.

Further, lower plate electrode 12 is present as an electrode isolation film between lower capacitor electrodes 11, so that no concave portion is formed between lower capacitor electrodes 11. This is different from the conventional semiconductor device in which the film of the same layer as the n type polysilicon film constituting lower capacitor electrodes 11 is removed by etching or the like from a region between lower capacitor electrodes 11 in order to isolate two lower capacitor electrodes 11. Thus, the top surface of each of dielectric film 13, upper capacitor electrode 14 and interlayer insulation film 15 that are formed on lower capacitor electrode 11 can be made relatively flat. This can prevent breaking of interconnections and the like due to the shape of the top surface of interlayer insulating film 15, when interconnections and the like placed above lower capacitor electrode 11 are formed on interlayer insulation film 15.

Referring to FIGS. 14 to 17, a method of manufacturing the semiconductor memory device shown in FIG. 13 will be described.

First, isolation insulation film 3 (see FIG. 14) is formed on the main surface of semiconductor substrate 2 (see FIG. 14) using a method similar to the manufacturing method in the first embodiment for the semiconductor memory device according to the present invention. In an element-forming region enclosed by isolation insulation film 3, n⁻ type diffusion region 4 (see FIG. 14) is formed on the main surface of semiconductor substrate 2. Moreover, a field effect transistor (not shown) constituting a memory cell is formed on the main surface of semiconductor substrate 2. Interlayer insulation film 5 (see FIG. 14) is formed on the main surface of semiconductor substrate 2. A resist film (not shown) having a pattern is formed on the top surface of interlayer insulation film 5, using the photolithography technique. The resist film is used as a mask to partially remove interlayer insulation film 5 by anisotropic etching. Thereafter, the resist film is removed. As such, contact hole 6 (see FIG. 14) is formed at interlayer insulation film 5. Then, n type polysilicon film 19 (see FIG. 14) is formed extending from the inside of contact hole 6 to the top surface of interlayer insulation film 5. This results in the structure shown in FIG. 14.

Next, resist film 26 (see FIG. 15) having a pattern is formed on the top surface of n type polysilicon film 19 (see FIG. 14), using the photolithography technique. Resist film 26 is disposed above a portion of n type polysilicon film 19 that is to be lower capacitor electrode 11 (see FIG. 15). Resist film 26 is then used as a mask for implanting boron into n type polysilicon film 19 as indicated by arrows 21 (see FIG. 15). The region of n-polysilicon film 19 doped with boron is changed to p type polysilicon film 22 (see FIG. 15). Further, n type polysilicon film 19 located below resist film 26 is isolated as lower capacitor electrode 11 (see FIG. 15). This results in the structure shown in FIG. 15. Subsequently, resist film 26 is removed.

Figure 16:
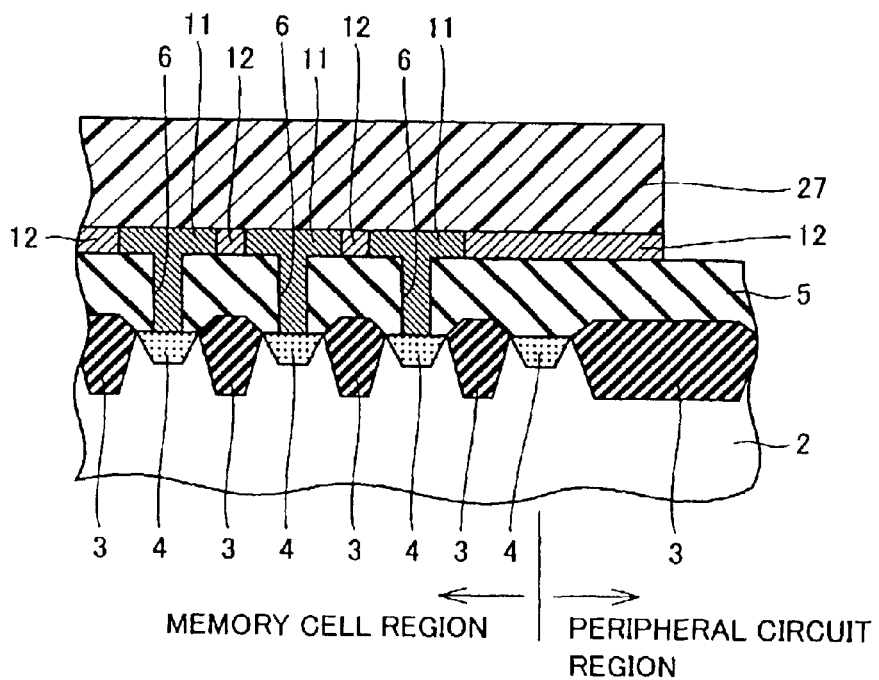

Next, a resist film 27 (see FIG. 16) is formed on the top surface of lower capacitor electrode 11 of an n type polysilicon film and p type polysilicon film 22, using the photolithography technique. Resist film 27 is formed to be located above the memory cell region. This resist film 27 is used as a mask to partially remove p type polysilicon film 22 by etching. Thus, lower plate electrode 12 disposed on the periphery of lower capacitor electrodes 11 is obtained as shown in FIG. 16.

Figure 17:
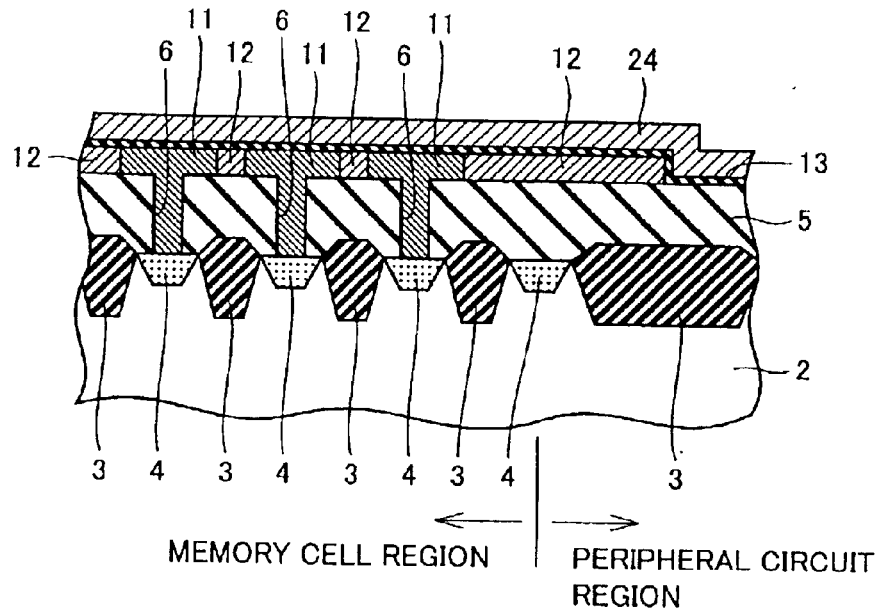

Subsequently, as shown in FIG. 17, dielectric film 13 is formed extending from the portion above lower capacitor electrode 11 and lower plate electrode 12 to the top surface of interlayer insulation film 5. Then, n type polysilicon film 24 is formed on dielectric film 13. The n type polysilicon film 24 constitutes an upper capacitor electrode.

Next, a resist film (not shown) having a pattern is formed on n type polysilicon film 24 using the photolithography technique. The resist film is used to partially remove n type polysilicon film 24, to form upper capacitor electrode 14 (see FIG. 13). Thereafter, as in the manufacturing method of the first embodiment for the semiconductor memory device according to the present invention, interlayer insulation film 15 having via holes 16a and 16b, plugs 17a and 17b filling in via holes 16a and 16b, and aluminum interconnections 18a and 18b electrically connected to plugs 17a and 17b are formed. Thus, the semiconductor memory device shown in FIG. 13 can be obtained.

Fourth Embodiment

Figure 18:
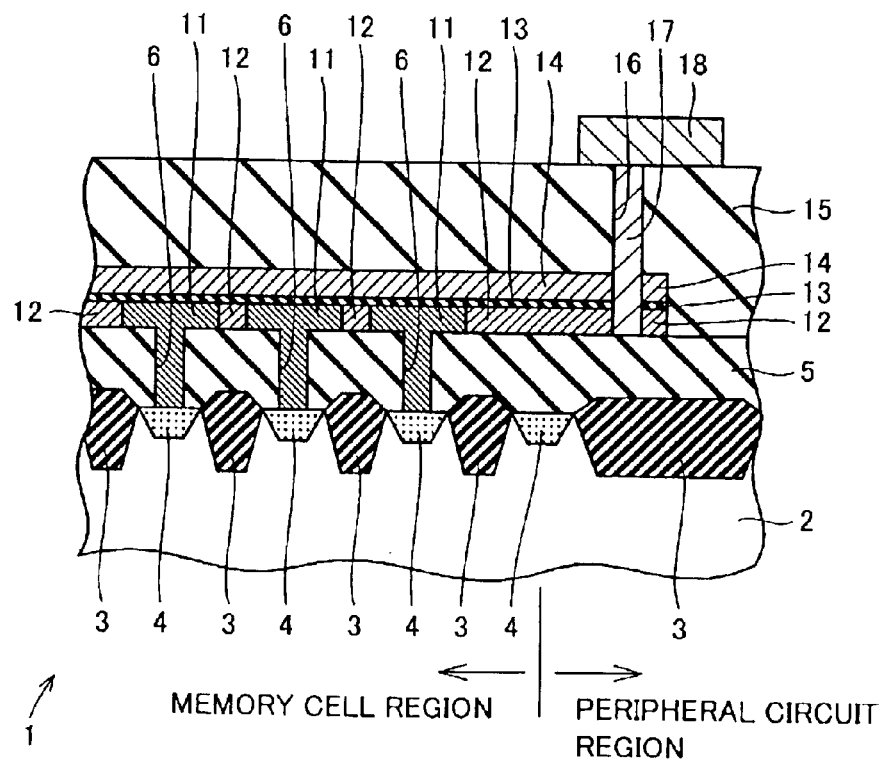
FIG. 18 shows a schematic cross-section view for illustrating the fourth embodiment of the semiconductor memory device according to the present invention.

Referring to FIG. 18, the fourth embodiment of the semiconductor memory device according to the present invention is described.

As shown in FIG. 18, semiconductor memory device 1 basically has a structure similar to that of the semiconductor memory device shown in FIG. 13, except for the structure of the portion applying a potential to upper capacitor electrode 14 and lower plate electrode 12. In semiconductor memory device 1 shown in FIG. 18, via hole 16, plug 17 and aluminum interconnection 18 for applying a potential to upper capacitor electrode 14 and lower plate electrode 12 are configured to have a structure similar to that of the corresponding portions in the semiconductor memory device shown in FIG. 10. Here, an effect similar to that of semiconductor memory device 1 shown in FIG. 13 as well as that of the semiconductor memory device shown in FIG. 10 can be obtained. The manufacturing method, which will be described later, shows that upper capacitor electrode 14 and lower plate electrode 12 may be continuously formed by one photolithography step.

Figure 19:
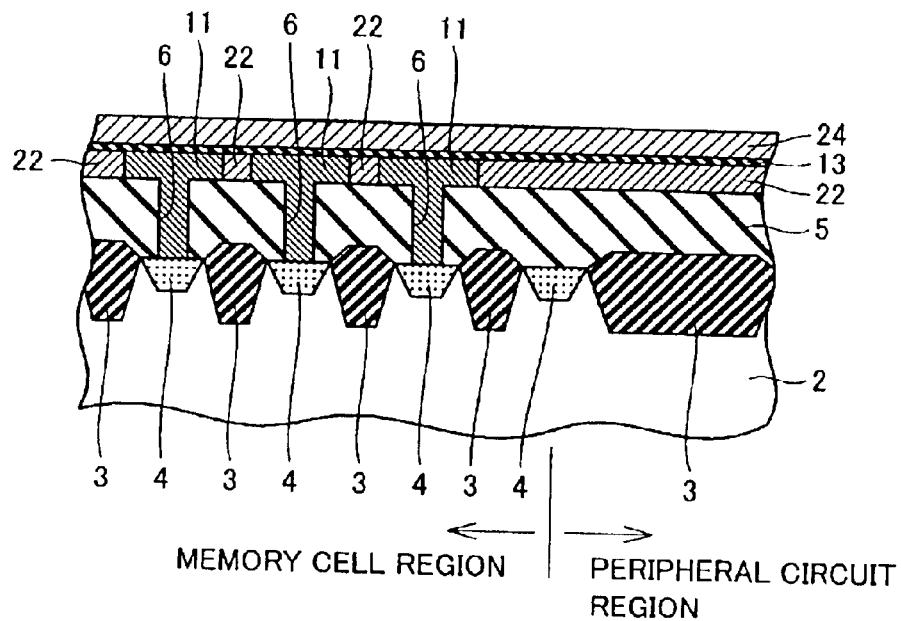
FIGS. 19 and 20 show schematic cross-section views for illustrating the first and second steps of a method of manufacturing the semiconductor memory device shown in FIG. 18.
Figure 20:
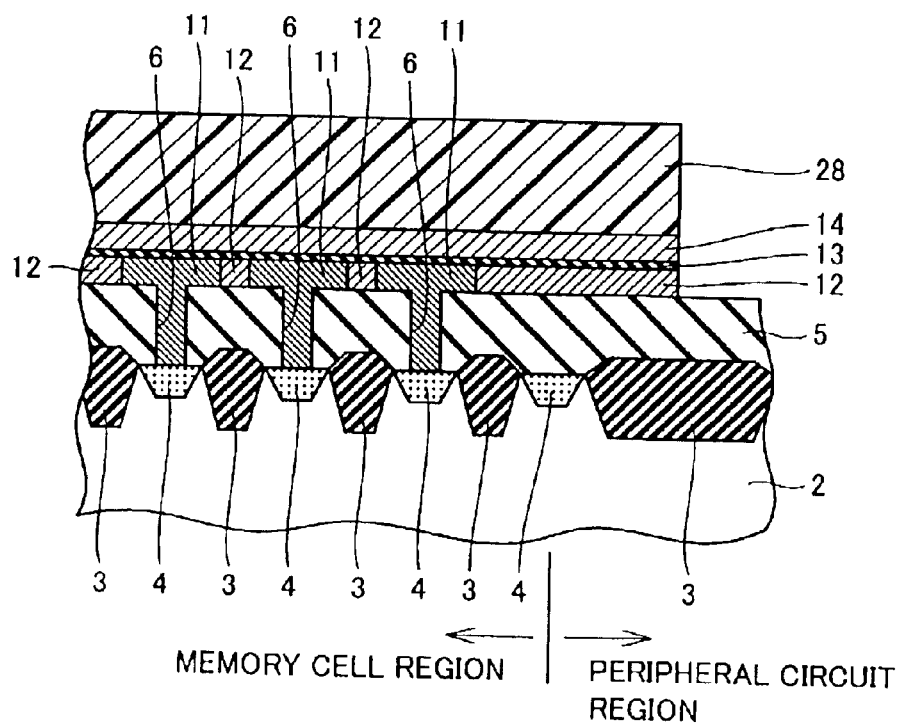

Referring to FIGS. 19 and 20, the method of manufacturing the semiconductor memory device shown in FIG. 18 will be described.

Figure 14:
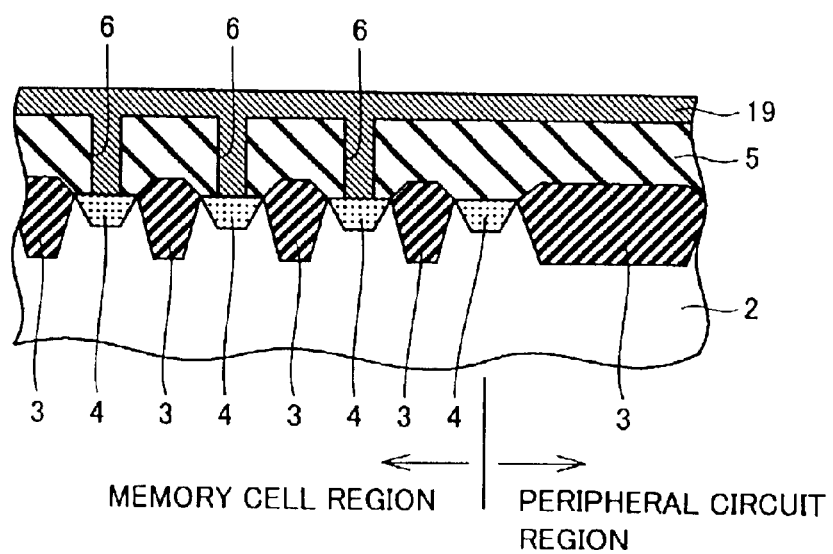
FIGS. 14 to 17 show schematic cross-section views for illustrating the first to the fourth steps of a method of manufacturing the semiconductor memory device shown in FIG. 13.
Figure 15:
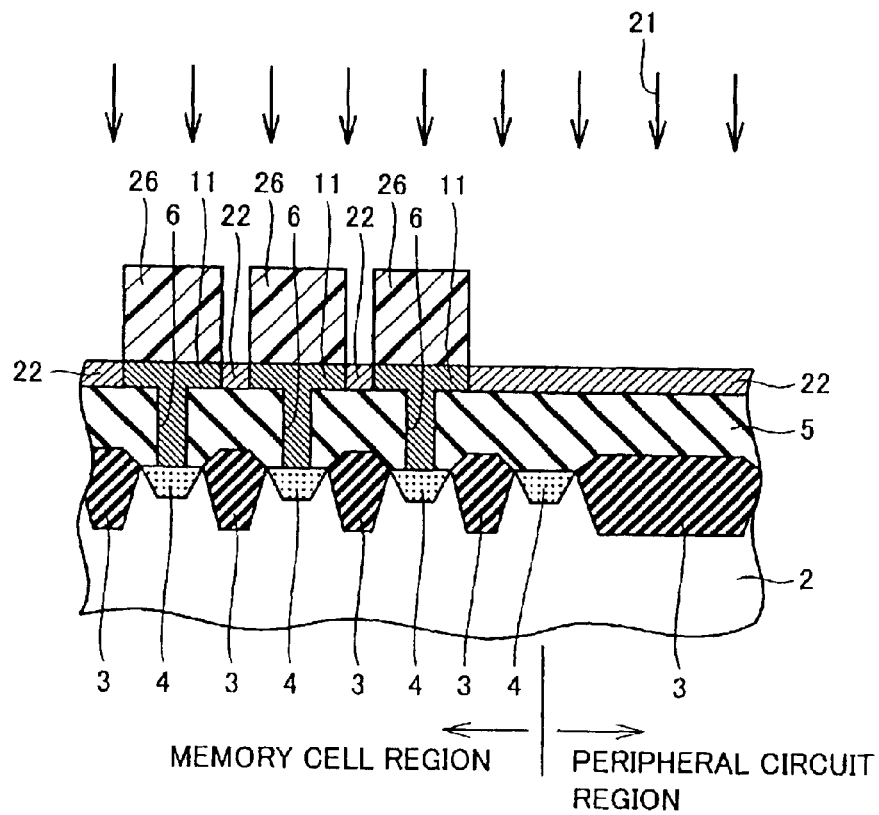

First, the steps shown in FIGS. 14 and 15 are performed. Subsequently, dielectric film 13 (see FIG. 19) is formed on the top surfaces of p type polysilicon film 22 and lower capacitor electrode 11. Further, n type polysilicon film 24 (see FIG. 19) is formed on dielectric film 13. This results in the structure as shown in FIG. 19.

Next, the photolithography technique is used to form a resist film 28 (see FIG. 20) having a pattern that covers a memory cell portion on n type polysilicon film 24. Resist film 28 is used as a mask to partially remove n type polysilicon film 24, dielectric film 13 and p type polysilicon film 22. This results in the structure as shown in FIG. 20.

Subsequently, resist film 28 is removed. Interlayer insulation film 15 is then formed on upper capacitor electrode 14 as in the manufacturing method of the second embodiment for the semiconductor memory device according to the present invention. Thereafter, interlayer insulation film 15, upper capacitor electrode 14, dielectric film 13 and lower plate electrode 12 are partially removed to form a via hole 16 (see FIG. 18). Plug 17 is formed to fill in via hole 16. Aluminum interconnection 18 (see FIG. 18) is formed on plug 17. Thus, the semiconductor memory device shown in FIG. 18 can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

two lower capacitor electrodes spaced apart from each other and formed from a common layer and including conductive impurities of a first conductivity type; and an electrode isolation film formed from said common layer and located between and in contact with said two lower capacitor electrodes, while including conductive impurities of a second conductivity type different from said first conductivity type.

2. The semiconductor device according to claim 1, wherein said lower capacitor electrodes and said electrode isolation film are formed by introducing conductive impurities of the first conductivity type and conductive impurities of the second conductivity type, respectively, into one semiconductor film.

3. The semiconductor device according to claim 1, further comprising a potential determination means for determining a potential of said electrode isolation film.

4. The semiconductor device according to claim 1, further comprising an upper capacitor electrode disposed on each of said two lower capacitor electrodes with a dielectric film interposed, said upper capacitor electrode being electrically connected with said electrode isolation film.

5. The semiconductor device according to claim 1, wherein a capacitor including said lower capacitor electrodes is a concave capacitor.

6. The semiconductor device according to claim 5, wherein each of said lower capacitor electrodes constituting said concave capacitor has a top surface, and said electrode isolation film extends to said top surface of each of said lower capacitor electrodes.

7. The semiconductor device according to claim 1, wherein a capacitor including said lower capacitor electrodes is a stacked capacitor.

8. A semiconductor device, comprising:

two lower capacitor electrodes spaced apart from each other and formed from a common layer and including conductive impurities of a first conductivity type; and an electrode isolation film formed from said common layer and located between said two lower capacitor electrodes, while including conductive impurities of a second conductivity type different from said first conductivity type, wherein a capacitor including said lower capacitor electrodes is a concave capacitor.

9. The semiconductor device according to claim 8, wherein each of said lower capacitor electrodes constituting said concave capacitor has a top surface, and said electrode isolation film extends to said top surface of each of said lower capacitor electrodes.

* * * * *